United States Patent [19]
Horikiri et al.

[11] Patent Number: 5,237,558
[45] Date of Patent: Aug. 17, 1993

[54] LASER DRIVE CIRCUIT FOR OPTICAL DISK RECORDING/REPRODUCING

[75] Inventors: Kenichi Horikiri, Sagamihara; Kazunori Tokiwa, Hachioji; Masahiro Sato, Yokohama, all of Japan

[73] Assignee: Kabushiki Kaisha Kenwood, Tokyo, Japan

[21] Appl. No.: 731,316

[22] Filed: Jul. 17, 1991

[30] Foreign Application Priority Data

Jul. 24, 1990 [JP] Japan .................................. 2-195729

[51] Int. Cl.$^5$ .............................................. G11B 7/00
[52] U.S. Cl. ...................................... 369/116; 369/54; 250/205; 372/29
[58] Field of Search .................. 369/116, 54, 121, 106, 369/122, 13, 54, 47; 250/205; 346/76 L; 360/114; 372/29, 31

[56] References Cited

U.S. PATENT DOCUMENTS

| | | | |
|---|---|---|---|
| 4,685,097 | 8/1987 | Van der Put | 369/116 |
| 4,692,606 | 9/1987 | Sakai et al. | 250/205 |
| 4,747,091 | 5/1988 | Doi | 369/116 |
| 4,785,443 | 11/1988 | Minami et al. | 369/116 |
| 4,858,219 | 8/1989 | Yoshikawa | 369/116 |

*Primary Examiner*—Aristotelis Psitos
*Assistant Examiner*—Thang V. Tran
*Attorney, Agent, or Firm*—Sixbey, Friedman, Leedom & Ferguson

[57] ABSTRACT

A laser driver circuit of an optical disk recording/reproducing apparatus includes a laser output detecting unit for detecting a digital average value of a laser output, first and second memories for storing a digital value of a current to be supplied to a laser diode, first and second D/A converters for converting the digital values stored in the first and second memories into analog values, and a current supplying unit for supplying a current proportional to an output of the first D/A converter or a current proportional to a sum of outputs of the first and second D/A converters to the laser diode.

8 Claims, 4 Drawing Sheets

LASER DRIVE CIRCUIT FOR OPTICAL DISK RECORDING/REPRODUCING

BACKGROUND OF THE INVENTION

1. Field of the Invention

The present invention relates to a write-once type optical disk recording/reproducing apparatus, and more particularly to a laser driver circuit for supplying current to a laser diode of an optical pickup.

2. Description of the Related Art

There is known a write-once (WO) type optical disk recording/reproducing apparatus which can write data only once in an optical disk using a laser beam.

With such an optical disk recording/reproducing apparatus, a laser beam is modulated by an EFM signal and applied to an optical disk to write a train of bits. In reproducing data, a laser beam having a constant low power is applied to a recorded bit train, and the reflected laser beam from the bit train is converted into current to reproduce the recorded data.

The current/output characteristic of a laser diode used for such an optical disk recording/reproducing apparatus changes with an ambient temperature or its own temperature under a long period of operation. A desired laser beam output cannot be obtained therefore by simply controlling a current to be supplied to a laser diode.

In view of this, the following approach has been used heretofore. Namely, a light receptor such as a photodiode is disposed near a laser diode. A current to be supplied to the laser diode is controlled such that a current of the light receptor generated upon reception of a laser beam becomes constant.

An example of a conventional laser driver circuit using such an approach is shown in FIG. 6.

In FIG. 6, reference numeral 1 represents a microcomputer which generates control signals such as LDC and REC signals for the control of a laser diode (LD).

Reference numeral 2 represents a transistor which supplies current to the laser diode LD. The collector of the transistor 2 is connected to a positive voltage source, and the emitter thereof is connected via a resistor R1 to the Anode of the laser diode LD.

Reference numeral 7 represents a constant current source for supplying a base current to the transistor 2. A current from the constant current source 7 flows distributively into the base of the transistor 2, a resistor R3, and the collector of a transistor 8.

The emitter of the transistor 8 is grounded, and the base thereof is grounded via a resistor and connected via another resistor to an LDC output terminal of the microcomputer 1.

The resistor R3 is connected to the collector of a transistor 6. The emitter of the transistor 6 is connected to a negative voltage source, and the base thereof is connected via a resistor to an output terminal of an operational amplifier 4.

A laser beam from the laser diode is received by a photodiode (PD) whose anode is grounded and whose cathode is connected to the negative voltage source via a parallel circuit of variable resistors VR3 and VR4. Between the variable resistor VR4 and the anode of the photodiode PD, there is connected an analog switch 3 which is opened when the REC signal outputted from the microcomputer 1 takes a low level (L), and closed when it takes a high level (H).

The anode of the photodiode PD is connected via a serial circuit of a resistor R2 and a capacitor C1 to the negative voltage source. The interconnection between the resistor R2 and the capacitor C1 is connected to the non-inverting input terminal of the operational amplifier 4. Connected between the inverting input terminal of the operational amplifier 4 and the negative voltage source is a constant voltage source 5.

The interconnection between the resistor R1 and the laser diode LD is connected to the collector of a transistor 11. The emitter of the transistor 11 is grounded via a resistor, and the base thereof is connected via a resistor to the movable contact of a variable resistor VR2.

The variable resistor VR2 is connected between the ground and the emitter of a transistor 10.

The collector of the transistor 10 is connected to the positive voltage source, and the base thereof is connected via a resistor to the output terminal of a NOR gate 9.

Inputted to the NOR gate 9 are REC and LDC signals from the microcomputer 1 and a recording date (EFM signal).

During a reproducing mode of the above-described laser driver circuit, the REC signal of the microcomputer 1 takes "H" level, and the LDC signal takes "L" level. The output of the NOR gate 9 becomes "L" accordingly, and the transistors 10 and 11 turn off. The emitter current of the transistor 2 will not distributively flow to the transistor 11, but only to the laser diode LD. In this case, the analog switch 3 is maintained open, and the transistor 8 is maintained turned off.

The laser diode LD radiates a laser beam whose light amount corresponds to the current flowing therethrough. The photodiode PD receiving a laser beam causes a current to flow to the variable resistor VR3, the current corresponding to the light amount of the laser beam.

A voltage generated across the variable resistor VR3 by the photodiode current is applied to the non-inverting input terminal of the operational amplifier 4. A voltage at the output terminal of the operational amplifier 4 is regulated such that the voltage applied to the non-inverting input terminal becomes equal to that of the constant voltage source 5.

The voltage at the output terminal of the operational amplifier 4 controls the collector current of the transistor 6, and hence the current distributively flowing to the resistor R3.

In the above manner, during the reproducing mode, a current to be supplied to the laser diode LD is controlled such that the light amount outputted from the laser diode LD becomes constant as defined by the variable resistor VR3.

During the recording mode, the REC and LDC signals from the microcomputer 1 takes and "L" level.

As a result, the analog switch 3 is maintained closed, and the transistor 8 is maintained turned off.

An output of the NOR gate 9 takes an "L" and "H" level as the recording data (EFM signal) takes an "H" and "L" level, respectively. The current flowing through the resistor R1 distributively flows to the transistors 10 and 11 when the output of the NOR gate 9 takes an "H" level, so that the current flowing through the laser diode LD is modulated by the EFM signal at a duty ratio 0.5.

The bottom current of the laser diode LD can be adjusted by the variable resistor VR2.

The laser diode LD radiates a laser beam whose light amount corresponds to the current flowing therethrough. The photodiode PD receiving a laser beam causes a current to flow to the variable resistors VR3 and VR4, the current magnitude corresponding to the light amount of the laser beam.

A voltage generated by the current across the variable resistors VR3 and VR4 is applied to the non-inverting input terminal of the operational amplifier 4 after its d.c. components are removed by a smoothing circuit of the resistor R2 and the capacitor C1.

A voltage at the output terminal of the operational amplifier 4 is regulated such that the voltage applied to the non-inverting input terminal becomes equal to that of the constant voltage source 5.

The voltage at the output terminal of the operational amplifier 4 controls the collector current of the transistor 6, and hence the current distributively flowing to the resistor R3.

In the above manner, during the recording mode, a current to be supplied to the laser diode LD is controlled such that the average light amount outputted from the laser diode LD becomes constant as defined by the variable resistors VR3 and VR4.

Neither in the recording mode nor in the reproducing mode, the LDC signal takes an "H" level so that the transistor 8 causes to cut the base current to the transistor 2 and no current will be supplied to the laser diode LD.

With the conventional laser driver circuit described above, it is possible to control the laser output light amount during a steady state in the recording or reproducing mode. However, there is a delay in detecting a laser beam output at the laser output control loop. There arise therefore some problem that the waveform of a laser output has a delayed leading edge or an overshoot when the operation changes from the reproducing mode to the recording mode.

SUMMARY OF THE INVENTION

The present invention has been made to solve the above problem. It is therefore an object of the present invention to provide a laser driver circuit for an optical disk recording/reproducing apparatus having an improved characteristics of a laser output when the operation is changed from a reproducing mode to a recording mode.

According to one aspect of the present invention, optical disk recording/reproducing apparatus with recording and reproducing modes comprises; a laser unit for generating a light beam for optical recording/reproducing, D/A converter for converting digital data into an analog laser drive signal to be applied to said laser unit, the drive signal defining the intensity level of the light beam generated from the laser unit a memory for storing first and second digital data which are respectively applied to the D/A converter means in the recording an reproducing mode, a detection unit for detecting the intensity level of the light beam generated from said laser unit, means for switching the digital data to be applied to the D/A converter means between the first and second digital data, and means in response to an update instruction for comparing the detected light beam intensity level with a target value and updating at least one of the first and second digital data stored in the memory.

According to another aspect of the present invention, the laser driver circuit for an optical disk recording/reproducing apparatus comprises, laser output detecting means for detecting a digital average value of a laser output, first and second storage means for storing a digital value of a current to be supplied to a laser diode, first and second D/A converters for converting the digital values stored in the first and second storage means into analog values, and current supplying means for supplying a current proportional to an output of the first D/A converter or a current proportional to a sum of outputs of the first and second D/A converters to the laser diode, wherein in a reproducing mode, the current supplying means supplies the current proportional to an output of the first D/A converter, and the digital value stored in the first storage means is updated at a predetermined interval so as to make the laser output takes a predetermined value, and in a recording mode, the current supplying means supplies, in response to a recording signal, the current proportional to a sum of outputs of the first and second D/A converters, and the digital value stored in one of the first and second storage means is updated at a predetermined interval so as to make the laser output takes a predetermined value.

In the laser driver circuit for an optical disk recording/reproducing apparatus, digital values stored in a non-volatile memory may be stored in the first and second storage means when a power is turned on.

In the laser driver circuit for an optical disk recording/reproducing apparatus, upon turning on a power, the laser driver circuit may be driven for a predetermined time period in the reproducing mode to update the digital value stored in the first storage means, and then the laser driver circuit is driven for a predetermined time period in the recording mode to update said digital value stored in the second storage means.

In the reproducing mode, a current proportional to an output of the first D/A converter is applied to the laser diode, and the digital value stored in the first storage means for determining an output of the first D/A converter is updated at a predetermined interval, thereby controlling the laser output to take a predetermined value.

In the recording mode, a current proportional to an output of the first D/A converter and a current proportional to a sum of outputs of the first and second D/A converters, are alternately supplied to the laser diode in response to a recording signal, and the digital value stored in the first storage means for determining an output of the first D/A converter or the digital value stored in the second storage means for determining an output of the second D/A converter, is updated at a predetermined interval, thereby controlling an average value of the laser output to take a predetermined value.

In the case where the operation changes from the recording mode to the reproducing mode or vice versa, since a feedback loop for temperature drift compensation is not operated, a current of the laser diode is controlled so as to quickly trace to the digital value stored in the first and second storage means, the stored digital value updated during the previous recording or reproducing mode so as to make the current of the laser diode to have a predetermined value. Accordingly, the laser output has a rapid leading edge or trailing edge and a small overshoot.

After turning on a power, the laser drive circuit may be driven for a predetermined time period in the reproducing mode to update the digital value stored in the first storage means, and then the laser driver circuit is driven for a predetermined time period in the recording mode to update said digital value stored in the second storage means. Therefore, by using the updated and stored digital value, a current of the laser diode has a rapid leading edge at the time of reproducing or recording.

Furthermore, in the case where proper digital values stored in a non-volatile memory are stored in the first and second storage means upon turning on the power, a starting current of the laser diode at the start time of recording or reproducing can be set as having a value nearer to the predetermined target value.

DETAILED DESCRIPTION OF THE EMBODIMENTS

Preferred embodiments of the present invention will be described with reference to the accompanying drawings.

Figure 1:
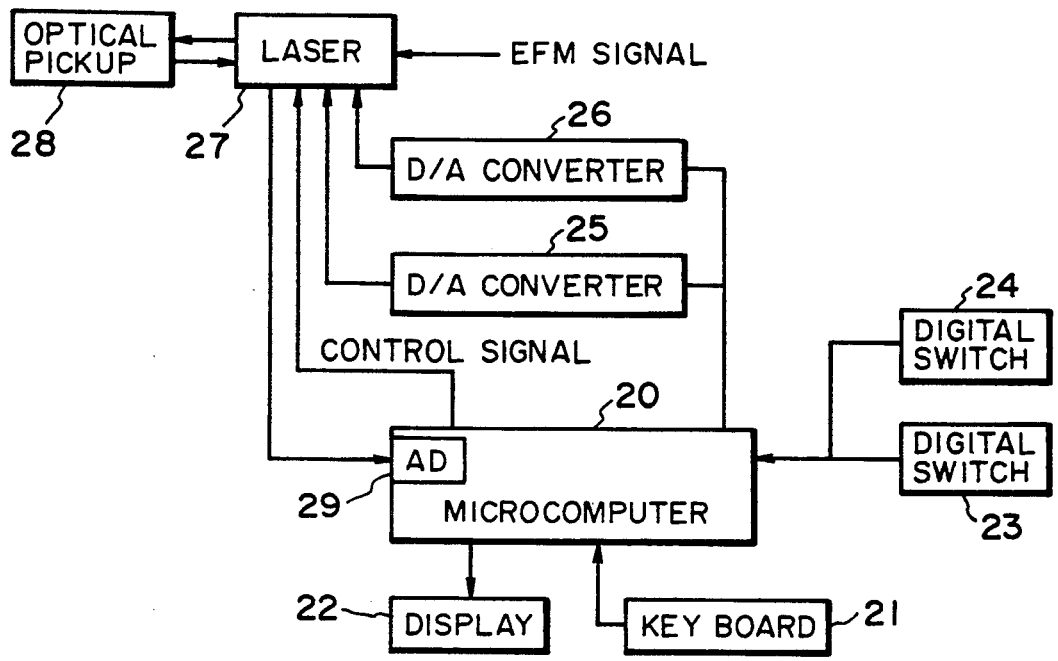
FIG. 1 is a block diagram showing the structure of a laser driver circuit for an optical disk recording/reproducing apparatus according to a first embodiment of the present invention.

FIG. 1 shows the structure of a laser driver circuit according to a first embodiment of the present invention.

In FIG. 1, reference numeral 20 represents a microcomputer having a RAM, ROM, and input/output interface. The microcomputer 1 runs on a program stored in ROM to enter data from various circuits shown and process it, the processed data being sent back to necessary circuits.

Reference numeral 21 represents a keyboard having an operation unit with a reproducing key and recording key, and a controlling unit with a mode select key.

Reference numeral 22 represents a display for displaying data supplied from the microcomputer 20.

Reference numerals 23 and 24 represent digital switches which are manually operated to supply hexadecimal numbers of two digits to the microcomputer 20.

Reference numerals 25 and 26 represent first and second D/A converters, respectively. The first and second D/A converters 25 and 26 convert hexadecimal numbers of two digits supplied from the microcomputer 20, into analog values which are then outputted to a laser circuit 27.

The laser circuit 27 is controlled by the microcomputer 20 into one of the laser stop mode, reproducing mode, and recording mode. In the reproducing mode, the laser 27 supplies to a laser diode of an optical pickup 28 a current proportional to an output of the D/A converter 25. In the recording mode, the laser circuit 27 supplies to the laser diode of the optical pickup 28 either a current proportional to an output of the D/A converter 25 or a current proportional to a sum of outputs of the D/A converters 25 and 26, in response to a recording signal (EFM signal).

In the laser stop mode, the laser circuit 27 does not supply current to the laser diode.

Reference numeral 29 represents an A/D converter built in the microcomputer 20.

A laser beam emanated from the laser diode of the optical pickup 28 is received by a photodiode and converted into a corresponding current which is in turn converted into a voltage by the laser circuit 27 and inputted to the A/D converter 29. The A/D converter 29 converts an inputted voltage into a digital data which is processed by the microcomputer 20.

Figure 2:
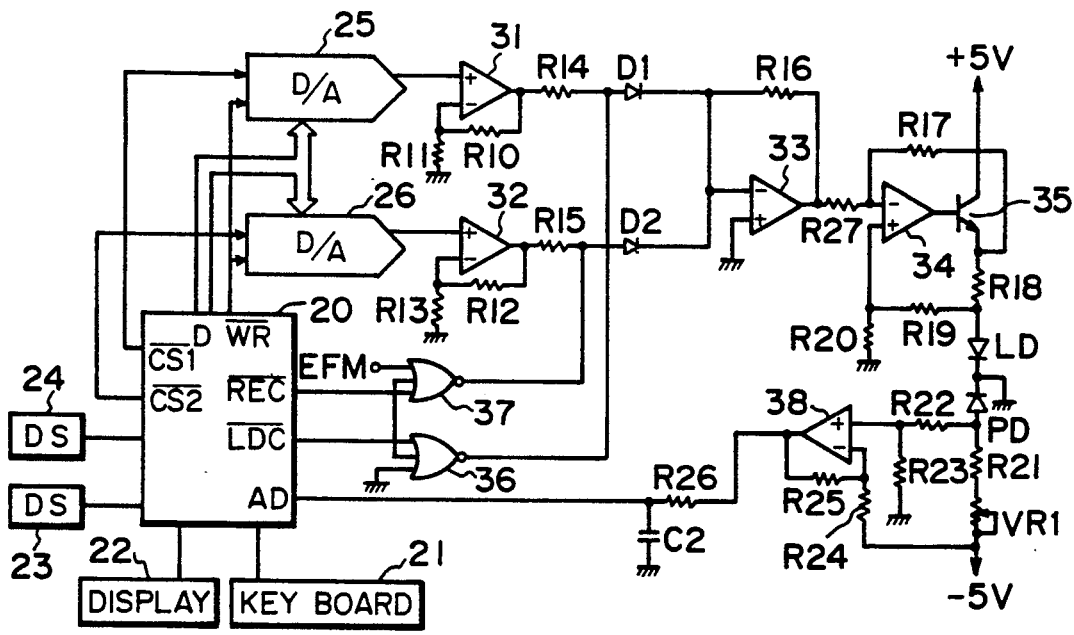
FIG. 2 is a circuit diagram of the laser driver circuit shown in FIG. 1.

FIG. 2 is a circuit diagram particularly showing the laser driver circuit shown in FIG. 1.

The detailed structure of the laser driver circuit shown in FIG. 1 will be given with reference to FIG. 2.

The microcomputer 20 and the D/A converters 25 and 26 are connected together by a data bus. The D/A converter 25 and 26 selected by a chip select signal CS1 or CS2 picks up a data on the data bus at the timing when a WR signal takes an "L" level.

Specifically, 8 bit data in RAM serving as first and second storage means at a particular address is read by the D/A converter 25 or 26 and converted into a voltage of any one of 256 steps.

The output terminals of the D/A converters 25 and 26 are connected to the non-inverting input terminals of operational amplifiers 31 and 32, respectively. The output voltages of the D/A converters 25 and 26 appear at the output terminals of the operational amplifiers 31 and 32, as multiplied by (1+R10/R11) and (1+R12/R13), respectively.

R10, R11, R12, and R13 indicate the resistance values of the feedback resistors R10, R11, R12, and R13 of the operational amplifiers 31 and 32, wherein R11=R12, and R11=R13.

The output terminals of the operational amplifiers 31 and 32 are connected, via a serial circuit of a diode D1 and a resistor R14 and a serial circuit of a diode D2 and a resistor R15, respectively, to the non-inverting input terminal of an operational amplifier 33. The non-inverting input terminal of the operational amplifier 33 is connected via a resistor 16 to its output terminal, and the inverting input terminal is grounded.

The interconnections, between the diode D1 and the resistor R14 and between the diode D2 and the resistor R15, are connected to the output terminals of NOR gates 36 and 37, respectively. The resistance values of the resistors R14 and R15 are the same.

When the outputs of the NOR gates 36 and 37 takes an "H" level, the output voltages of the operational amplifiers 31 and 32 are inverted, amplified, and added together by the operational amplifier, 33, the result being outputted from the output terminal of the operational amplifier 33. However, when the outputs of the NOR gates 36 and 37 take an "L" level, the output voltages of the operational amplifiers 31 and 32 are cut so that no output voltage appears at the output terminal of the operational amplifier 33.

The output terminal of the operational amplifier 33 is connected via resistor R27 to the non-inverting input terminal of an operational amplifier 34 whose output terminal is connected to the base of a transistor 35.

The transistor 35 is used for supplying a current to the laser diode LD. The collector of the transistor 35 is connected to a +5 V power source, and the emitter thereof is connected via a resistor R18 to the anode of the laser diode LD.

The anode of the laser diode LD is grounded via a serial circuit of a resistor R19 and a resistor R20. The interconnection between the resistors R19 and R20 is connected to the non-inverting input terminal of the operational amplifier 34. The emitter of the transistor 35 is also connected via a resistor R17 to the non-inverting input terminal of the operational amplifier 34.

A potential at the output terminal of the operational amplifier 33 relative to the ground potential is inverted and amplified by the operational amplifier 34 and applied to the base of the transistor 35, thereby controlling a voltage drop across the resistor R18.

The resistance values of the resistors R19 and R20 are set such that a current flowing through the serial circuit of the resistors R19 and R20 becomes sufficiently smaller than that flowing through the laser diode LD.

In the above manner, currents proportional to the inputted data to the D/A converters 25 and 26 are added together and supplied to the laser diode LD.

The anode of the photodiode PD receiving a laser beam from the laser diode LD is grounded, and the cathode thereof is connected via a serial circuit of a resistor R21 and a variable resistor VR1 to a −5 V power source.

The anode of the photodiode PD is also grounded via a serial circuit of resistors R22 and R23. The interconnection between the resistors R22 and R23 is connected to the non-inverting input terminal of an operational amplifier 38.

The output terminal of the operational amplifier 38 is connected to the −5 V power source via a serial circuit of resistors R"5 and R24. The interconnection between the resistors R25 and R24 is connected to the non-inverting input terminal of the operational amplifier 38.

A voltage proportional to the current flowing through the photodiode PD appears at the output terminal of the operational amplifier 38, by properly setting the resistance values of the resistors R21, R22, R23, R24, and R25. The voltage at the output terminal of the operational amplifier 38 is inputted to the A/D converter built in the microcomputer 20 as a mean value after the output of the amplifier 38 is smoothed by a smoothing circuit of a resistor R26 and a capacitor C2.

A proportionality factor between a current of the photodiode PD and an output voltage of the operational amplifier 38 can be set to any arbitrary value by adjusting the variable resistor VR1.

Inputted to the NOR gate 37 are REC and LDC signals outputted from the microcomputer 1 and a recording data.

Inputted to the NOR gate 36 is an LDC signal outputted from the microcomputer 1.

In the laser driver circuit constructed as above, during the reproducing mode, the REC signal from the microcomputer 1 takes an "H" level, and the LDC signal takes an "L" level. Therefore, the NOR gate 37 outputs an L level signal, and the NOR gate 36 outputs an H level signal.

The laser diode LD is supplied with a current proportional to an output of the D/A converter 25, and emanates a laser beam having a light amount corresponding to the supplied current. The photodiode PD receiving a laser beam generates a current corresponding to a laser beam output.

During the recording mode, the REC signal of the microcomputer 1 outputs an L level signal, and the LDC signal outputs an L level signal.

An output of the NOR gate 37 takes an "L" and "H" level as the recording data (EFM signal) takes an "H" and "L" level, respectively. The current flowing through the laser diode LD is cut when an output of the NOR gate 37 takes an "L" level, so that the current of the laser diode is modulated by the EFM signal at a duty ratio 0.5.

The bottom current of the laser diode LD takes a current proportional to an output voltage of the operational amplifier 31.

The laser diode LD radiates a laser beam whose light amount corresponds to the current flowing therethrough. The photodiode PD receiving a laser beam generates a current corresponding to a laser beam output, and a voltage proportional to the d.c. components of the current is applied to the A/D converter in the microcomputer 1.

An amplifier 4 is regulated such that the voltage applied to the non-inverting input terminal becomes equal to that of the constant voltage source 5.

Neither in the recording mode nor in the reproducing mode, the LDC signal takes an "H" level so that the NOR gates 36 and 37 cause the outputs of the operational amplifiers 31 and 32 to be cut and no current will be supplied to the laser diode LD.

The operation of the laser driver circuit constructed as above will be described below.

First, there is selected a laser output detector calibrating mode, using the keyboard.

In this mode, a current proportional to an output of the D/A converter 25 is supplied to the laser diode LD, and a data set by the digital switch 23 is inputted to the D/A converter 25.

A voltage applied to the A/D converter in the microcomputer 20 is displayed on the display 22.

An output meter is mounted over the objective lens of the optical pickup 28, and the digital switch 23 is operated to make the value measured by the output meter indicate 5 mW.

A voltage applied to the A/D converter of the microcomputer 20 is proportional to an output of the laser diode LD, the proportionally factor therebetween changing with the resistance value of the variable resistor VR1.

Figure 3:
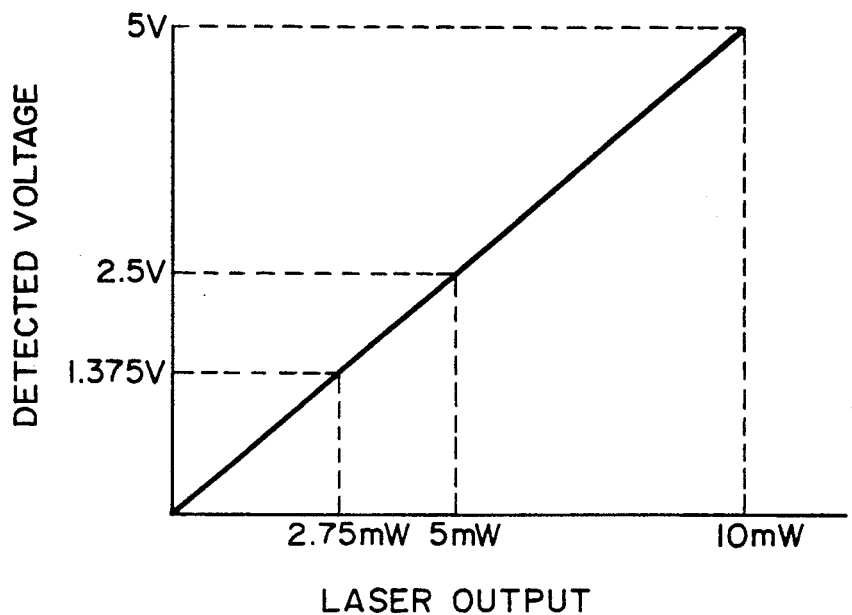
FIG. 3 is a graph showing a relationship between a laser output and its detected voltage of the embodiment shown in FIG. 1.

While observing the voltage applied to the A/D converter and displayed on the display, the variable resistor VR1 is adjusted to obtain such a relationship as shown in FIG. 3, between an input voltage to the A/D converter and an output of the laser diode LD.

In this case, since an output of the laser diode LD is 5 mW, the variable resistor VR1 is adjusted to make the input voltage to the A/D converter displayed on the display indicate 2.5 V.

After this adjustment, an output of the laser diode LD can be known from the relationship shown in FIG. 3, by using an input voltage to the A/D converter as a key.

Figure 4:
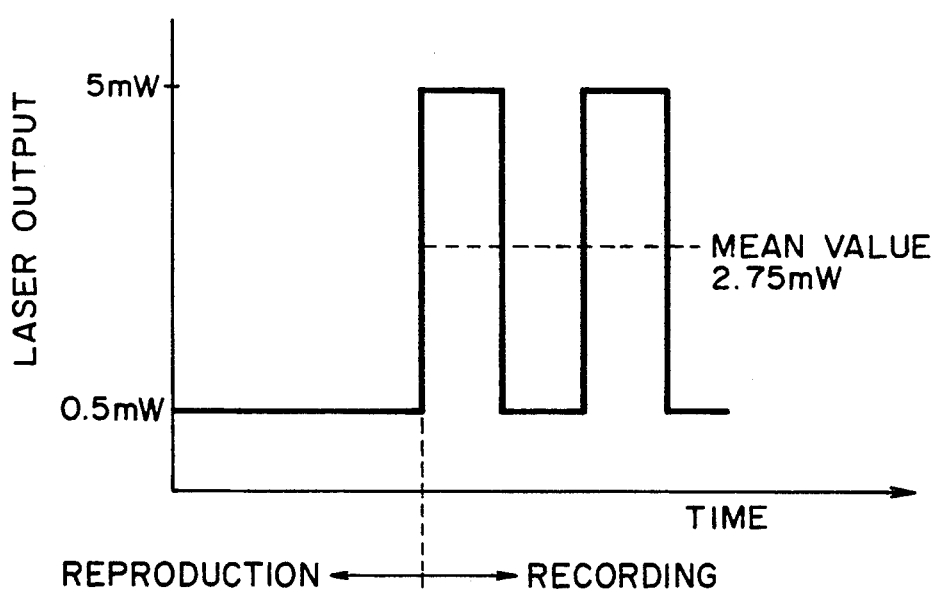
FIG. 4 is a graph showing the waveform of a laser output.

Next, in the above mode, the digital switch 23 is again set. Target output values of the laser diode are as shown in the graph of FIG. 4.

As described above, during the reproducing mode, the bottom power of the laser diode of 0.5 mW is used for the reproducing laser target output, and during the recording mode the output power of the laser diode is set so as to change between the bottom power of 0.5 mW (0.25 V) and peak power of 5 mW (2.5 V) as modulated by the EFM signal having a duty ratio 0.5 so that the mean value of 2.75 mW (1.375 V) is used for the recording laser target output.

Accordingly, the digital switch 23 is set such that an input voltage to the A/D converter displayed on the display indicates 0.25 V in accordance with the relationship shown in FIG. 3.

Next, a setting mode for the digital switch 24 is selected using the keyboard.

In this mode, a current proportional to an output of the D/A converter 25 and a sum of currents of the D/A converters 25 and 26 are alternately modulated by the EFM signal and supplied to the laser diode LD, and data set by the digital switches 23 and 24 are inputted to the D/A converters 25 and 26, respectively, while a voltage applied to the A/D converter of the microcomputer 20 being displayed on the display 22.

In this mode, the digital switch 23 is remained unchanged, but the digital switch 24 is set to make the voltage applied to the A/D converter and displayed on the display indicate 1.375 V, on the basis of FIGS. 3 and 4, which is the mean value of 0.25 V and 2.5 V.

The initial setting is completed in the above manner. Upon turning on the power, 8 bit data set by the digital switches is read from RAM of the microcomputer 20 at particular addresses, RAM serving as first and second storage means.

Figure 5:
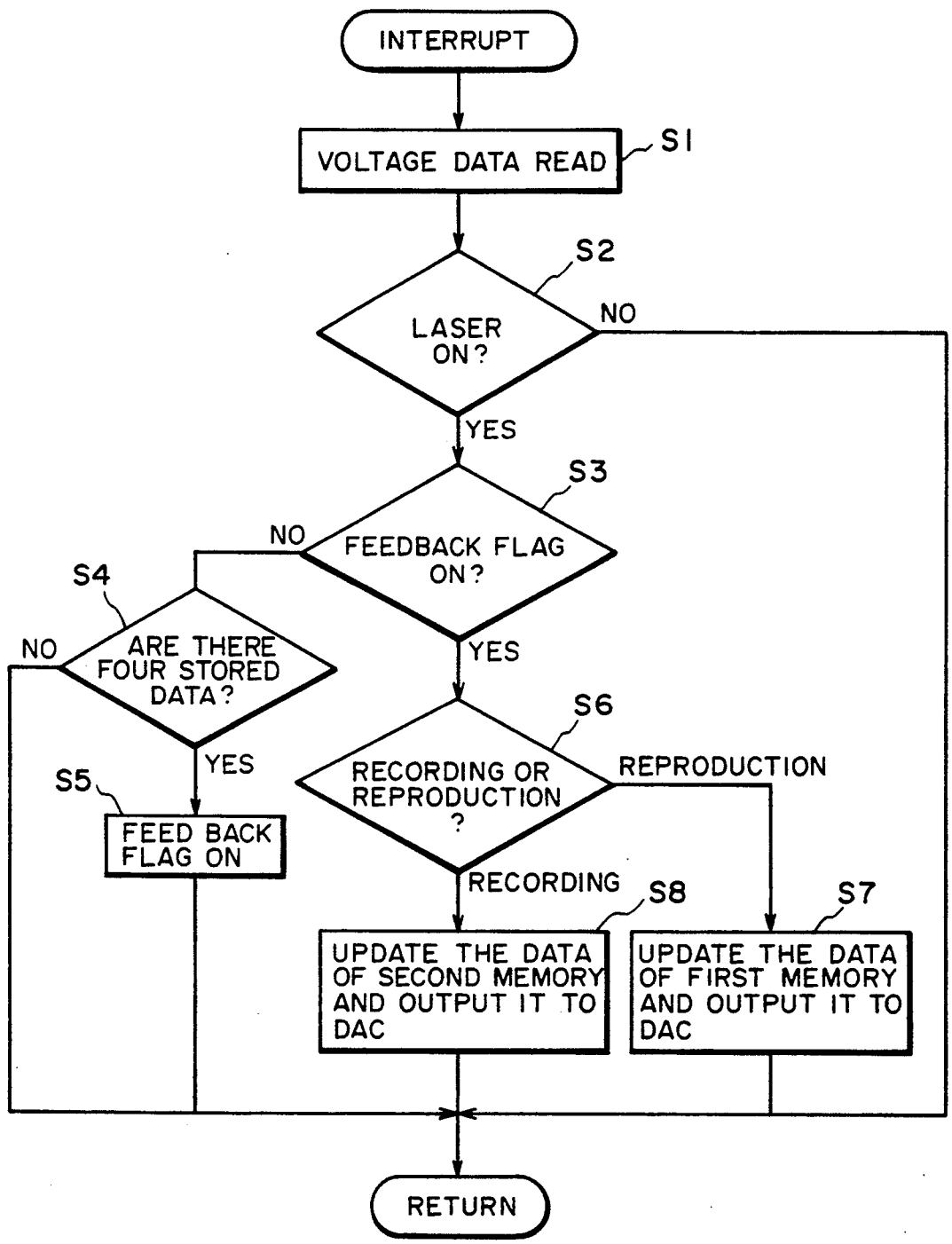
FIG. 5 is a flow chart illustrating a part of the processes to be executed by the microcomputer of the embodiment shown in FIG. 1.
Figure 6:
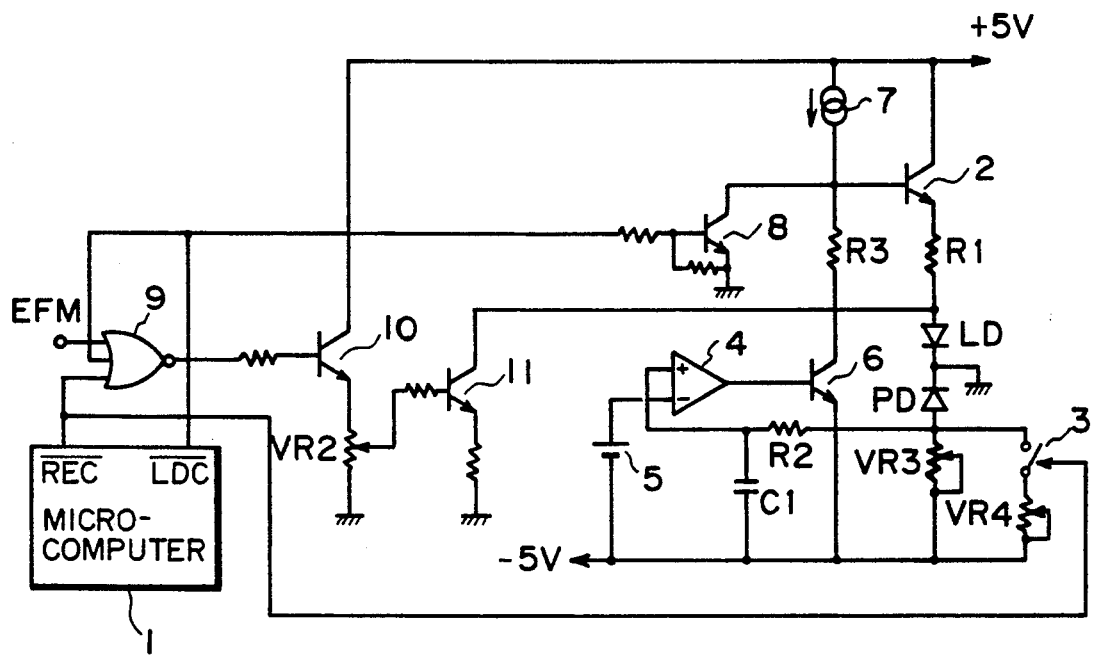
FIG. 6 is a circuit diagram showing an example of a conventional laser driver circuit for an optical disk recording/reproducing apparatus.

The reproducing mode and recording mode are selected by the keyboard on the operation panel. At this time, the current of the laser diode is determined in accordance with the stored data in RAM. In the reproducing and recording modes, the laser output control routine shown in FIG. 5 is executed at a predetermined time interval to thereby update the data stored in RAM, because the output characteristic of the laser diode changes with temperature.

When this routine is executed, a voltage applied to the A/D converter is first read at step S1 and stored in RAM. The latest four data $D(n)$, $D(N-1)$, $D(n-2)$, and $D(n-3)$ are stored in RAM at four addresses. When the reproducing mode or recording mode is initially selected, the stored data is cleared.

Next, at step S2, it is checked if a current is being supplied to the laser diode LD.

If a current is being supplied to the laser diode, the control advances to step S3. If not, the routine is terminated.

It is checked at step S3 if a feedback flag is on or off. If on, the control advances to step S4. The feedback flag is turned on when the reproducing mode or recording mode is selected.

It is checked at step S4 if the latest four input voltage data of the A/D converter are being stored. If stored, the control advances to step S5. If not, the routine is terminated.

At step S5, the feedback flag is turned on, and thereafter the routine is terminated.

It is checked at step S6 if the operation is in the recording mode or in the reproducing mode. In the case of the recording mode, the control advances to step S8. In the case of the reproducing mode, the control advances to step S7.

At step S7, there are calculated differences between the target input voltage of the A/D converter during the reproducing mode, i.e., 0.25 V, and the latest four input voltages, the differences being represented by $E(n)$, $E(n-1)$, $E(n-2)$, and $E(n-3)$. Next, there is calculated a correction amount $\Delta U$ which is obtained by multiplying the respective differences by four weighting constants $K_1$ to $K_4$ and adding the multiplied results together, the correction amount being given by $\Delta U = K_1 E(n) + K_2 E(n-1) + K_3 E(n-2) + K_4 E(n-3)$. The correction amount is added to the 8 bit data stored in RAM, at a particular address serving as the first storage means, of the microcomputer 20. The added result is stored in RAM at the same address, and inputted to the D/A converter 25.

The feedback control through a PID operation is carried out in the above manner. This sub-routine terminates at step S7.

At step S8, there are calculated differences between the target input voltage of the A/D converter during the recording mode, i.e., mean value of 1.375 V and the latest four input voltages. Next, there is calculated a correction amount which is obtained by multiplying the respective difference by four constants and adding the multiplied results together. The correction amount is added to the 8 bit data stored in RAM, at a particular address serving as the second storage means, of the microcomputer 20. The added result is stored in RAM at the same address, and inputted to the D/A converter 26 to thus performing the PID operation. This sub-routine terminates at step S8.

In this embodiment, in the recording mode, the data in the first memory means may be updated instead of the data in the second storage means. In this embodiment, the bottom power of 0.5 mW is determined by the output from the D/A converter 25, and the peak power of 5 mW is determined by the sum of the outputs from the D/A converters 25 and 26. Since the curve of light output v. drive current in the laser diode is parallely shifted for temperatures, the drive current compensation is the same for 0.5 mW and 5 mW. Accordingly, in the recording mode, when 0.1 mW is reduced for the rising temperature, it is possible to update the drive signal from D/A converter 25 for the target output 0.5 mW so that the peak value becomes 5 mW.

Also in this embodiment, digital switches are used as the non-volatile memories. Instead of digital switches, a battery backed-up RAM may be used and the data stored in RAM is entered by operating the keyboard.

A second embodiment of the present invention is realized by omitting the digital switches 24 and 25 shown in FIGS. 1 and 2.

In the second embodiment, an optional data is made capable of being set to the D/A converter 25 through the keyboard during the laser output detection circuit calibrating mode.

Upon turning on the power, the optical pickup is retracted from the recording area of an optical disk. In this condition, the reproducing mode is first made effective for a predetermined time period to update the data in the first storage means, and then the recording mode is made effective for a predetermined time period to update the data in the second storage means. As the initial values of the data in the first and second storage means, data stored in ROM is used.

According to the above-described embodiments, it is possible to set a starting current of the laser diode suitable for the temperature at the time of operation.

As described so far, according to the laser driver circuit for an optical disk recording/reproducing apparatus of the present invention, a laser output does not fluctuate even if a temperature change occurs, and the leading edge characteristic of a laser output can be improved when the operation changes from the reproducing mode to the recording mode, thereby making free from recording errors at the operation start period.

What is claimed is:

1. Optical disk recording/reproducing apparatus operating with recording and reproducing modes, comprising:
    a laser diode for emitting a light beam for optical disk pickup, the light beam being proportional to a supplied current;
    first D/A converter means operably connected to said laser diode for producing a first current according to a set value and supplying the first current to said laser diode so that said laser diode emits a light beam of a first predetermined intensity;
    second D/A converter means operably connected to said laser diode for producing a second current which can be selectively added to the first current so that said laser diode emits a light beam of a second predetermined intensity;
    control means connected to said first and second D/A converter means for controlling said first and second D/A converter means so that during the reproducing mode the first current is supplied to said laser diode by said first D/A converter means and during the recording mode the first current and the sum of the first and second currents are alternately supplied to said laser diode by said first and second D/A converter means; and
    updating means associated with said first D/A converter means for updating the set value at a predetermined interval in response to the temperature change in the light emission intensity vs. supplied current characteristics of said laser diode to operate the light beam at said first and second predetermined intensities.

2. The apparatus of claim 1 further comprising a memory connected between said updating means and said first D/A converter means which receives the updated set value from said updating means, stores said set value, and provides said set value to said first D/A converter means.

3. The apparatus of claim 2 wherein said set value is updated in the reproducing mode.

4. The apparatus of claim 3 wherein the set value is further updated in the recording mode.

5. The apparatus of claim 1 further including detecting means for detecting light beam intensity level values and a memory connected to said first D/A converting means and said detecting means for storing a predetermined number of said detected light beam intensity level values.

6. The apparatus of claim 5 wherein the set value is calculated by weighting the predetermined number of the last detected light beam intensity level values stored in said memory.

7. The apparatus of claim 2 further comprising means for turning the apparatus on and off and wherein digital values stored in a nonvolatile memory are used to provide an initial set value when the apparatus is turned on.

8. The apparatus of claim 7 wherein upon turning on the apparatus, the apparatus is driven during a first predetermined setup time period in said reproducing mode to update said set value.

* * * * *